(12) United States Patent
Lee et al.

(10) Patent No.: US 11,769,824 B2
(45) Date of Patent: Sep. 26, 2023

(54) GALLIUM NITRIDE TRANSISTOR WITH A DOPED REGION

(71) Applicant: TEXAS INSTRUMENTS INCORPORATED, Dallas, TX (US)

(72) Inventors: Dong Seup Lee, McKinney, TX (US); Jungwoo Joh, Allen, TX (US); Pinghai Hao, Plano, TX (US); Sameer Pendharkar, Allen, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 17/165,697

(22) Filed: Feb. 2, 2021

(65) Prior Publication Data

US 2021/0159329 A1     May 27, 2021

Related U.S. Application Data

(62) Division of application No. 16/194,794, filed on Nov. 19, 2018, now Pat. No. 10,964,803.

(51) Int. Cl.
| | |
|---|---|
| *H01L 29/778* | (2006.01) |
| *H01L 21/265* | (2006.01) |
| *H01L 29/06* | (2006.01) |
| *H01L 29/20* | (2006.01) |
| *H01L 29/417* | (2006.01) |

(Continued)

(52) U.S. Cl.
CPC ...... *H01L 29/7786* (2013.01); *H01L 21/2654* (2013.01); *H01L 29/0603* (2013.01); *H01L 29/0607* (2013.01); *H01L 29/0843* (2013.01); *H01L 29/2003* (2013.01); *H01L 29/41775* (2013.01); *H01L 29/66431* (2013.01); *H01L 29/66462* (2013.01); *H01L 29/0891* (2013.01); *H01L 29/42316* (2013.01)

(58) Field of Classification Search
CPC ......... H01L 29/66431; H01L 29/66462; H01L 29/778–7789; H01L 2924/13064; H01L 29/122–127; H01L 29/15–158; H01L 29/802; H01L 29/0843–0891; H01L 29/66636–66643; H01L 21/823418–823425; H01L 29/41725–41791; H01L 29/7839; H01L 29/806; H01L 29/7848; H01L 29/0603; H01L 29/0607; H01L 29/7786; H01L 29/42316; H01L 29/1029; H01L 29/1058; H01L 29/1066; H01L 29/41775; H01L 21/2654; H01L 29/2003
See application file for complete search history.

(56) References Cited

U.S. PATENT DOCUMENTS

| | | |
|---|---|---|
| 7,816,707 B2 | 10/2010 | Hikita et al. |
| 9,196,614 B2 | 11/2015 | Kub et al. |

(Continued)

FOREIGN PATENT DOCUMENTS

WO    2018174872 A1    9/2018

*Primary Examiner* — Sonya McCall-Shepard
(74) *Attorney, Agent, or Firm* — Yudong Kim; Frank D. Cimino

(57) ABSTRACT

In some examples, a transistor comprises a gallium nitride (GaN) layer; a GaN-based alloy layer having a top side and disposed on the GaN layer, wherein source, drain, and gate contact structures are supported by the GaN layer; and a first doped region positioned in a drain access region and extending from the top side into the GaN layer.

22 Claims, 7 Drawing Sheets

(51) Int. Cl.
  *H01L 29/66*   (2006.01)
  *H01L 29/08*   (2006.01)
  *H01L 29/423*  (2006.01)
  *H01L 29/10*   (2006.01)

(56) References Cited

U.S. PATENT DOCUMENTS

| | | | |
|---|---|---|---|
| 2002/0079508 A1 | 6/2002 | Yoshida | |
| 2007/0018199 A1 | 1/2007 | Sheppard et al. | |
| 2008/0258150 A1 | 10/2008 | McCarthy et al. | |
| 2011/0263102 A1 | 10/2011 | Heikman et al. | |
| 2011/0284865 A1* | 11/2011 | Inoue | H01L 29/0843 |
| | | | 257/E21.403 |
| 2014/0264379 A1 | 9/2014 | Kub et al. | |
| 2017/0092751 A1 | 3/2017 | Frijkink | |
| 2017/0117402 A1* | 4/2017 | Koyama | H01L 29/0843 |
| 2018/0083133 A1 | 3/2018 | Bayram et al. | |
| 2019/0115448 A1* | 4/2019 | Chowdhury | H01L 29/8083 |
| 2019/0371930 A1 | 12/2019 | Shrivastava et al. | |
| 2020/0127116 A1* | 4/2020 | Chen | H01L 21/0254 |

* cited by examiner

GALLIUM NITRIDE TRANSISTOR WITH A DOPED REGION

CROSS REFERENCE TO RELATED APPLICATIONS

This application is a divisional of U.S. Nonprovisional patent application Ser. No. 16/194,794, filed Nov. 19, 2018, the contents of which are herein incorporated by reference in its entirety.

BACKGROUND

Gallium nitride (GaN) based semiconductor devices deliver characteristics that are better than silicon-based devices. GaN-based semiconductor devices have faster-switching speed and excellent reverse-recovery performance which is critical for low-loss and high-efficiency performance.

SUMMARY

In accordance with some examples, a transistor, comprises a gallium nitride (GaN) layer; a GaN-based alloy layer having a top side and disposed on the GaN layer, wherein source, drain, and gate contact structures are supported by the GaN layer; and a first doped region positioned in a drain access region and extending from the top side into the GaN layer.

In accordance with some examples, a transistor, comprises a gallium nitride (GaN) layer; a GaN-based alloy layer supported by the gallium nitride layer, the GaN-based alloy layer having a top side; a drain contact structure, a gate contact structure, and a source contact structure, wherein the drain, gate, and source contact structures are supported by the gallium-based alloy layer; and a highly-doped region positioned in a drain access region, wherein the highly-doped region is configured to prevent an extension of a depletion region to the drain contact region.

In accordance with some examples, a method for fabricating a transistor, comprises obtaining a substrate including a gallium nitride (GaN) layer, a GaN-based alloy layer disposed on the GaN layer and having a top side; implanting a dopant to form a first doped region extending from the top side into the GaN layer in a drain access region; and depositing source, drain, and gate contact structures that are supported by the GaN layer.

BRIEF DESCRIPTION OF THE DRAWINGS

For a detailed description of various examples, reference will now be made to the accompanying drawings in which.

DETAILED DESCRIPTION

Figure 1A:
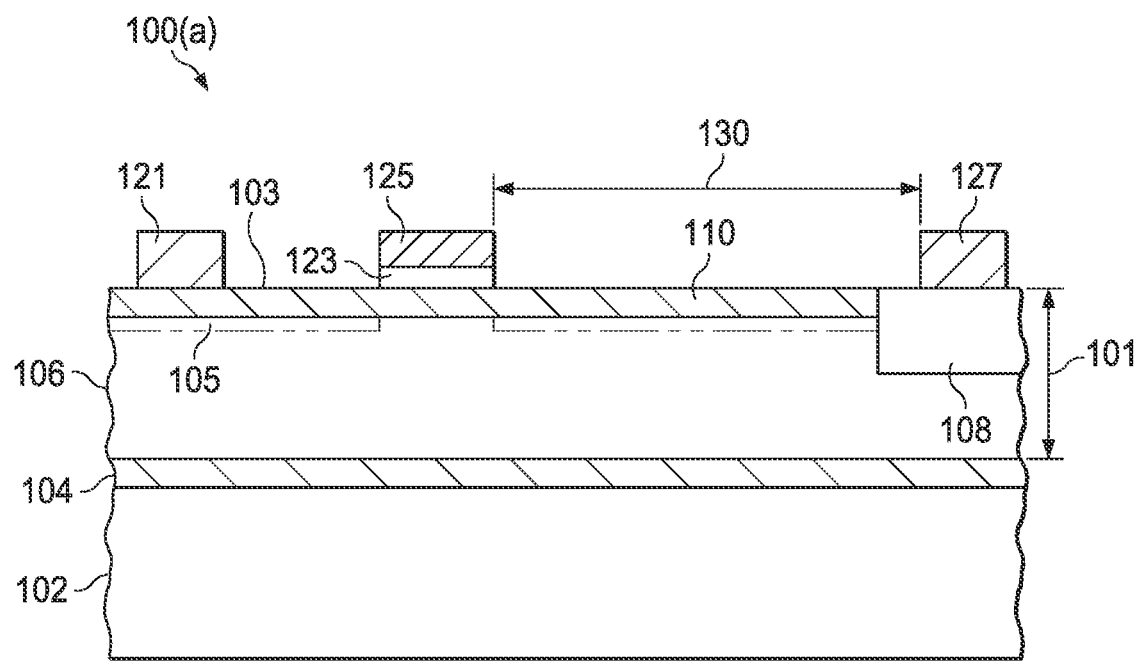
FIG. 1(a) depicts a cross-section of an illustrative GaN-based high electron mobility transistor (HEMT), in accordance with various examples.

High electron mobility transistors (HEMTs) typically include a layer of highly-mobile electrons, which are induced by forming a heterostructure including a group III nitride-based alloy with broader band-gap (e.g., aluminum gallium nitride (AlGaN)) grown over another group III nitride material with a narrower bandgap (e.g., GaN). The large conduction-band offset, spontaneous polarization, and piezoelectric polarization in such a heterostructure induce a highly-mobile 2-dimensional electron gas (2DEG) at their interface. For the sake of illustration, some of the description herein focuses on AlGaN/GaN heterostructures. However, this description is not limited to AlGaN/GaN-based heterostructures and can be applied to other heterostructures that can induce the 2DEG at their interface. Existing semiconductor fabrication techniques can be used to manufacture HEMTs using AlGaN/GaN-based heterostructures on a substrate (e.g., a semiconductor wafer).

HEMTs are fabricated such that the 2DEG is formed between the source and drain contact structures of the HEMT. A gate contact structure is generally positioned between the source and drain contact structures. HEMTs can be classified as enhancement mode HEMTs (or e-HEMTs) or depletion mode HEMTs (or d-HEMTs). e-HEMTs are designed such that a depletion region forms under the gate contact structure at the AlGaN/GaN interface, meaning that electrons under the gate contact structure are depleted, making e-HEMTs normally-OFF devices. e-HEMTs can be turned ON by applying a positive threshold voltage to the gate contact structure. On the other hand, d-HEMTs are designed such that the 2DEG is always present at the AlGaN/GaN interface between the source and drain contact structures, meaning that d-HEMTs are normally-ON devices. d-HEMTs are turned OFF by applying a negative threshold voltage to the gate contact structure.

In high-voltage (e.g., operating voltage over 500V) applications, both enhancement and depletion mode HEMTs suffer from a back gating effect in that a depletion region forms in a region under/around the drain contact structure due to a relative negative bias between the 2DEG and the substrate. Thus, both e-HEMTs and d-HEMTs, under the off-state, suffer from the back gating effect, which can result in the depletion region extending to the drain contact structure, which can then lead to failure of the HEMT. Enhancement and depletion mode HEMTs are prone to failure, however, this issue is significant in p-GaN based enhancement mode HEMTs. This is because the design of e-HEMTs permits a relatively low electron density in their 2DEG; especially in the case of e-HEMTs designed using p-type GaN based gate structures. Consequently, the depletion region forms and eventually extends to the drain contact structure at a voltage lower than the operating voltage.

The electron density of the 2DEG may be increased to prevent the extension of the depletion region to the drain contact region. However, increasing 2DEG electron density presents additional challenges. In e-HEMTs, increasing 2DEG electron density may result in a partially-ON (at zero gate voltage) HEMT. On the other hand, increasing 2DEG electron density in d-HEMTs increases the overall electric field of d-HEMTs and a more negative threshold voltage needs to be applied to the gate contact structure to turn the HEMT OFF. Other alternative techniques include injecting holes in the depletion region around the drain contact structure to reduce the extension of the depletion region. Such technologies require re-growing GaN, which increases the process complexity and cost. Therefore, a solution that addresses the issues mentioned above is desired.

Accordingly, at least some of the examples disclosed herein are directed towards an HEMT with a modified design assembly. At least some of the examples are directed towards GaN-based HEMTs. The modified design is equipped to prevent the extension of the depletion region towards the drain contact structure. In at least some examples, the modified design includes a highly-doped implantation region positioned in the HEMT. The highly-doped implantation region selectively increases the electron density under and/or below the drain contact structure and prevents the extension of the depletion region towards the drain contact structure. The presence of the highly-doped implantation region under the source contact region improves the ON resistance of the Gan-based HEMT. Hence, in some examples, the modified design assembly includes two highly-doped implantation regions. One that is present below the source contact structure and the other positioned below the drain contact structure.

Referring now to FIG. 1(a), a cross-section of an illustrative GaN-based HEMT 100(a) (hereinafter HEMT 100 (a)) with the modified design assembly is shown. HEMT 100(a) depicted in FIG. 1(a) is an enhancement mode HEMT. The HEMT 100(a) is fabricated on a substrate 102, which can include silicon, silicon carbide, sapphire, gallium nitride-based substrate or other suitable substrate material. In examples where silicon based substrate is employed, the substrate 102 has a seed layer 104 deposited on it. In some examples, the seed layer 104 has a thickness of 0.1-0.5 microns. Seed layer 104, in such examples, is necessary for the subsequent growth of a heterostructure 101. The seed layer 104 of the illustrative HEMT 100(a) includes aluminum nitride (AlN). In other examples, other suitable material that can facilitate the growth of the heterostructure 101 may be used as the seed layer 104. Growing the heterostructure 101 may not require the seed layer 104 in examples where gallium-based substrate is employed.

The heterostructure 101 includes a GaN layer 106 and an AlGaN layer 110. In some examples, a buffer layer (not expressly depicted in FIG. 1(a)) between the seed layer 104 and the GaN layer 106 is grown. In other examples, the GaN layer 106 is grown on the seed layer 104. In some examples, the GaN layer 106 may be doped with carbon, or some other suitable dopant. A layer of a GaN-based alloy, such as AlGaN 110, is grown over the GaN layer 106. The AlGaN layer 110 can be derived from a general form of a GaN-based alloy comprising: Al(X)In(Y)Ga(1−X−Y)N, where X and Y are the concentrations of Aluminum and Indium, respectively. In some examples, the AlGaN layer 110 may have a uniform composition. For example, a composition of Al(0.3)Ga(0.7)N uniformly forming the AlGaN layer 110. In other examples, AlGaN layer 110 may have a graded composition of Aluminum, Gallium, and Indium. For example, different compositions, such as Al(0.2)Ga(0.8)N; Al(0.1)Ga(0.9)N may form the AlGaN layer 110. In other examples, another variety/composition of GaN-based alloy can be grown on the GaN layer 106.

AlGaN layer 110 has a top side 103, which is sometimes referred to as top surface 103. In some examples, the thickness of AlGaN layer 110 can be in the range of few nanometers (e.g., 5 nm) to a few hundred nanometers (e.g., 300 nm). In some examples, the thickness of GaN layer 106 can be in the range of few nanometers (e.g., 5 nm) to a few microns (e.g., 50 um). FIG. 1(a) also depicts a 2DEG 105 that is formed at the interface of the GaN layer 106 and the AlGaN layer 110. As noted above, 2DEG 105 is enabled by the large conduction band offset of the GaN layer 106 and the AlGaN layer 110. Although the description herein assumes a HEMT, including a heterostructure comprising AlGaN layer 110/GaN layer 106 that forms the 2DEG 105 at their interface, this disclosure also applies to the HEMT, including a heterostructure comprising a first layer composed group III nitride and a second layer composed of a different group III nitride (or a combination of group III-V nitride), where this heterostructure is configured to induce a 2DEG at the interface of the first and second layers. In the aforementioned description, group III and V are the group of elements of the widely known periodic table of elements.

The HEMT 100(a) further includes a source contact structure 121, a gate contact structure 125, and a drain contact structure 127. The source contact structure 121, the gate contact structure 125, and the drain contact structure 127 are supported by the AlGaN layer 110. The term "support" or "supported by" is intended to mean either an indirect or direct support. Thus, if the drain contact structure 127 is supported by the AlGaN layer 110, that support may be through a direct support or through an indirect support via other layers. Therefore, the contact structures 121, 125, 127 can also be said to be supported by the GaN layer 106. The source contact structure 121 forms an ohmic contact with the AlGaN layer 110. The ohmic contact is a low resistance junction that provides current conduction between the source contact structure 121 and the AlGaN layer 110. The HEMT 100(a), when functioning in enhancement mode, includes a p-doped GaN layer 123 (hereinafter pGaN layer 123) that is positioned on the top surface 103. A gate contact structure 125 is positioned on the pGaN layer 123. The pGaN layer 123 enables the HEMT 100(a) to function in the enhancement mode as the presence of the pGaN layer 123 depletes the electrons present in the 2DEG 105 under the pGaN layer 123. Due to this phenomenon, HEMT 100(a) is considered normally OFF and thus requires a positive threshold voltage applied at the gate contact structure 125 to turn it ON. The gate contact structure 125 forms, in one example, an ohmic contact with the pGaN layer 123. In other examples, a Schottky contact can be formed between the two.

FIG. 1(a) further depicts a drain access region 130. In some examples, the drain access region 130 is a region between the gate contact structure 125 and the drain contact structure 127 at the AlGaN layer 110/GaN layer 106 interface. HEMT 100(a) includes a highly-doped region 108 (which can sometimes be referred to as a doped region 108) that extends from the top surface 103 into the GaN layer 106. In the example shown in FIG. 1(a), the highly-doped region 108 is positioned such that the drain contact structure 127 forms an ohmic contact with the highly-doped region 108. FIG. 1(a) shows the highly-doped region 108 partially extending into the drain access region 130. In other examples, the highly-doped region 108 may not extend into the drain access region 130. In such an example, the drain access region 130 exists between edges (not expressly marked) of the gate contact structure 125 and the drain contact structure 127. As noted above, the highly-doped region 108 is configured to prevent the extension of a depletion region (not expressly shown) towards the drain contact structure 127 by locally increasing the electron density. Stated another way, the highly-doped region 108 increases the channel density of the 2DEG (not expressly shown) under the drain contact structure 127 to prevent the extension of the depletion region towards the drain contact structure 127. This prevents the depletion region from contacting the drain contact structure 127 and thus inhibits the failure of HEMT 100(a). The highly-doped region 108 can include silicon, germanium, or other suitable dopants. The concentration of the dopants can be over $1e^{17}$ cm$^{-3}$. The depletion region can be defined as a region where the channel (e.g., 2DEG) electrons are depleted.

Figure 1B:
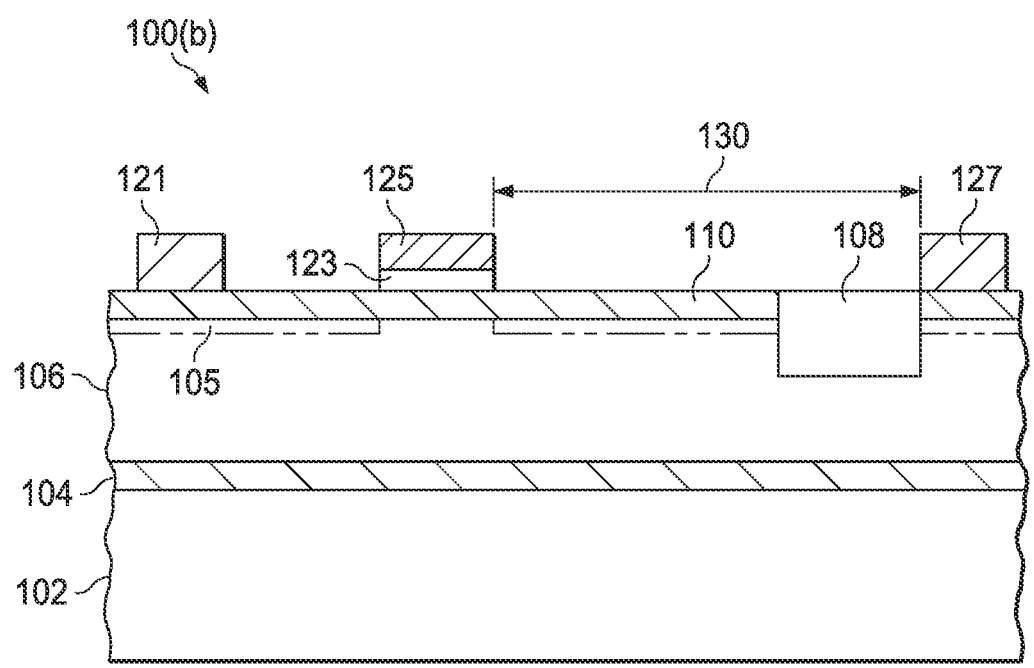
FIG. 1(b) depicts a cross-section of another illustrative GaN-based HEMT, in accordance with various examples.

Referring now to FIG. 1(b), a cross-section of another illustrative GaN-based HEMT 100(b) (hereinafter HEMT 100(b)) with the modified design assembly is shown. HEMT 100(b) also functions in the enhancement mode. HEMT 100(b) has a similar structure as HEMT 100(a) except for the position of the highly-doped region 108. In the example shown in FIG. 1(b), the highly-doped region 108 is positioned in the drain access region 130. In this example, the drain contact structure 127 forms an ohmic contact with the AlGaN layer 110. The highly-doped region 108 of FIG. 1(b) is configured to prevent the extension of a depletion region (not expressly shown) towards the drain contact structure 127 by increasing the electron density of the 2DEG 105 in the drain access region 130. This inhibits the depletion region from extending towards the drain contact structure 127, and prevents the depletion region to contact the drain contact structure 127, thus preventing the failure of HEMT 100(b).

Figure 1C:
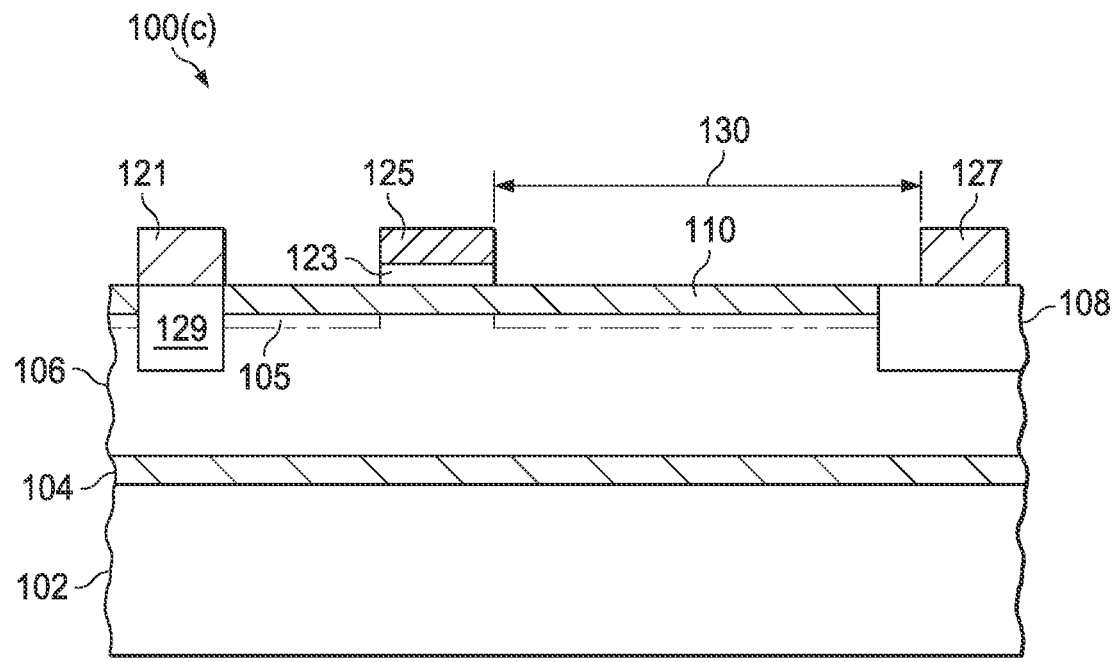
FIG. 1(c) depicts a cross-section of another illustrative GaN-based HEMT, in accordance with various examples.

Referring now to FIG. 1(c), a cross-section of yet another illustrative GaN-based HEMT 100(c) (hereinafter HEMT 100(c)) with the modified design assembly is shown. HEMT 100(c) also functions in the enhancement mode. HEMT 100(c) has a similar structure as HEMT 100(a) except for the presence of an additional highly-doped region 129 formed below the source contact structure 121. In this example, the source contact structure 121 forms an ohmic contact with the AlGaN layer 110. In this example, the highly-doped region 108 is configured to prevent the extension of a depletion region (not expressly shown) towards the drain contact structure 127 by increasing the electron density of the 2DEG 105 in the drain access region 130. The highly-doped region 129 is configured to decrease the ON resistance of the HEMT 100(c).

Figure 1D:
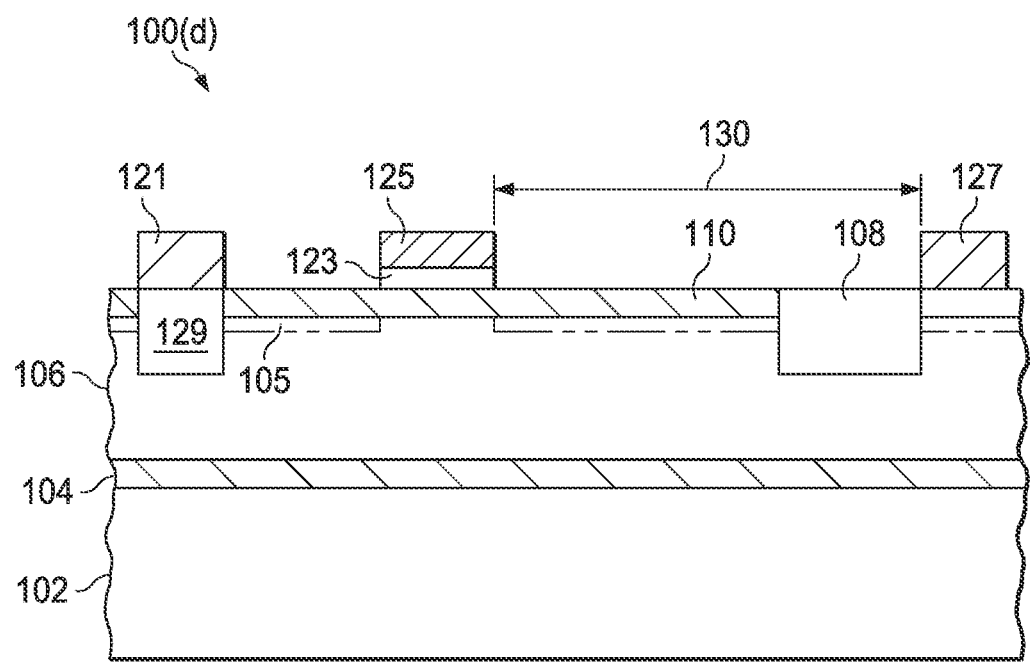
FIG. 1(d) depicts a cross-section of another illustrative GaN-based HEMT, in accordance with various examples.

Referring now to FIG. 1(d), a cross-section of another illustrative GaN-based HEMT 100(d) (hereinafter HEMT 100(d)) with the modified design assembly is shown. HEMT 100(d) functions in the enhancement mode. HEMT 100(d) has a similar structure as HEMT 100(b) except for the presence of an additional highly-doped region 129. In this example, the source contact structure 121 forms an ohmic contact with the highly-doped region 129. In this example, the highly-doped region 108 is configured to prevent the extension of a depletion region (not expressly shown) towards the drain contact structure 127 by increasing the electron density of the 2DEG 105 in the drain access region 130 and the highly-doped region 129 is configured to decrease the ON resistance of the HEMT 100(d).

Figure 1E:
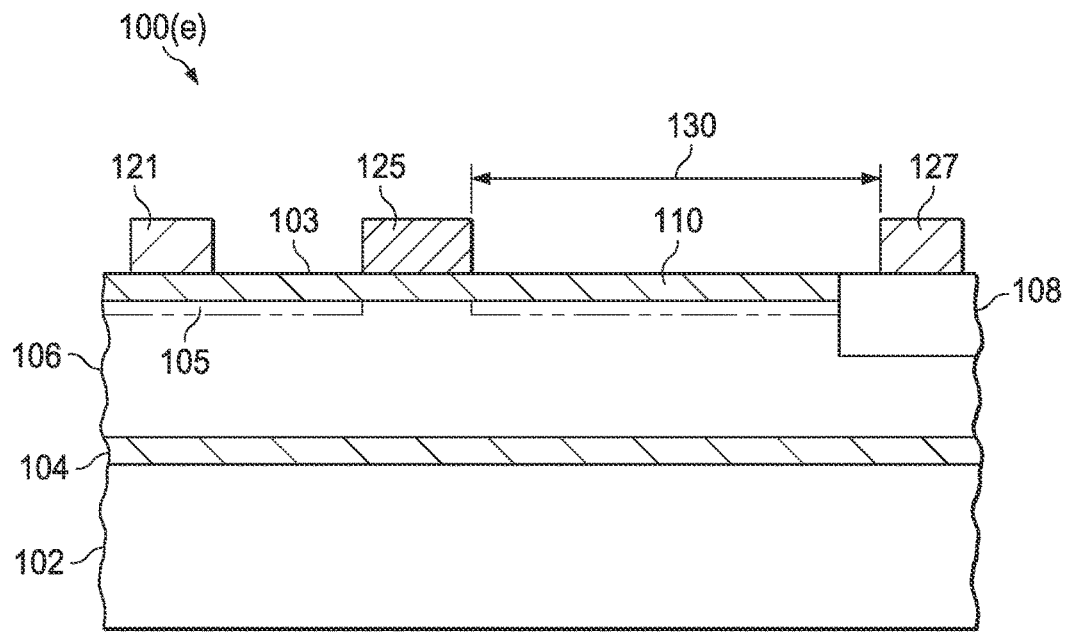
FIG. 1(e) depicts a cross-section of another illustrative GaN-based HEMT, in accordance with various examples.

Referring now to FIG. 1(e), a cross-section of yet another illustrative GaN-based HEMT 100(e) (hereinafter HEMT 100(e)) with the modified design assembly is shown. HEMT 100(e) functions in a depletion mode—meaning that HEMT 100(e) is normally ON and requires a negative threshold voltage to be applied to the gate contact structure 125. The 2DEG 105 of FIG. 1(e) forms a complete channel between the source and drain contact structures 121, 127, respectively. The absence of pGaN layer 123 (see FIG. 1(a)) in HEMT 100(e) enables HEMT 100(e) to function in the depletion mode.

FIG. 1(e) includes a highly-doped region 108 that extends from the top surface 103 into the GaN layer 106. In the example shown in FIG. 1(a), the highly-doped region 108 is positioned in HEMT 100(e) such that the drain contact structure 127 forms an ohmic contact with the highly-doped region 108. As can be seen in FIG. 1(a), the highly-doped region 108 partially extends into the drain access region 130. In other examples, the highly-doped region 108 may not extend into the drain access region 130 and is positioned under the drain contact structure 127. As noted above, the highly-doped region 108 is configured to prevent the extension of a depletion region (not expressly shown) towards the drain contact structure 127 by locally increasing the electron density. Stated another way, the highly-doped region 108 increases the channel density under the drain contact structure 127 so as to prevent the depletion region to extend towards the drain contact structure 127. This prevents the failure of HEMT 100(e). Similar to the illustrative HEMT 100(b) depicted in FIG. 1(b), the position of the highly-doped region 108 of HEMT 100(e) may be altered. For example, the highly-doped region 108 of HEMT 100(e) may be positioned in the drain access region 130 (similar to the highly-doped region 108 of FIG. 1(b)). In such examples, the drain contact structure 127 forms an ohmic contact with the AlGaN layer 110.

Similar to other illustrative examples of the enhancement mode HEMTs described above, HEMT 100(e) may be altered to take a different form. In some examples, HEMT 100(e) may include an additional highly-doped region formed below the source contact structure 121, such as the highly-doped region 129 shown in FIG. 1(c).

Figure 2A:
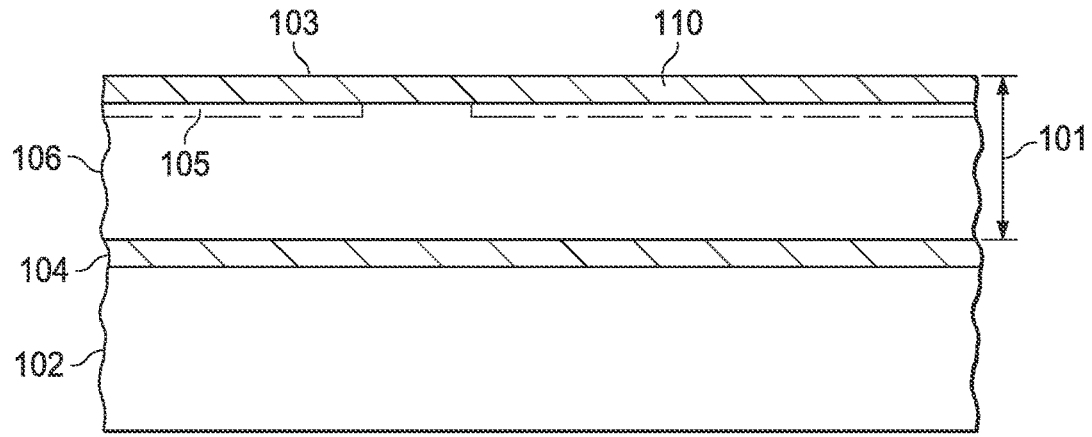
FIGS. 2(a)-2(f) are illustrative flow diagrams depicting the steps involved in fabricating an enhancement mode HEMT (e-HEMT), in accordance with various examples.
Figure 4:
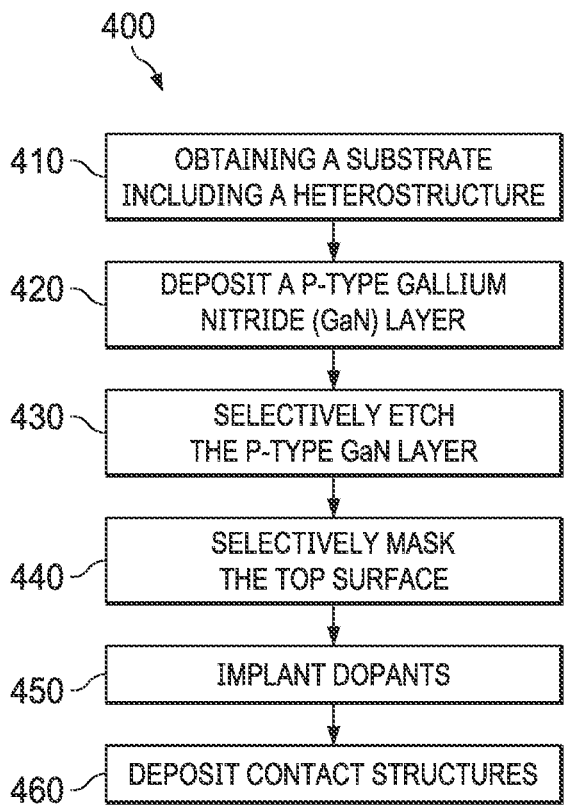
FIG. 4 depicts an illustrative method to fabricate an e-HEMT, in accordance with various examples.

FIG. 4 depicts an illustrative method 400 to fabricate an e-HEMT that includes one or more highly-doped regions. FIGS. 2(a)-2(f) are illustrative flow diagrams depicting at least some of the steps involved in fabricating the enhancement mode HEMT that includes one or more highly-doped regions. The method 400 is now described in tandem with FIG. 2(a)-FIG. 2(f). The method 400 begins with obtaining a substrate 102 including a heterostructure 101 (step 410; FIG. 2(a)). The heterostructure 101 is supported by the substrate 102. The heterostructure 101 is grown on the seed layer 104 using chemical vapor deposition, or using other suitable deposition processes. For illustration sake, it is assumed that the substrate 102 includes silicon. The heterostructure 101, in some examples, includes the GaN layer 106 and the AlGaN layer 110, where the AlGaN layer 110, having the top side 103, is grown on the GaN layer 106. Stated another way, the heterostructure 101 has a top side 103. FIG. 2(a) further depicts the 2DEG 105 formed at the AlGaN 110/GaN 106 interface. AlGaN layer 110 forms when aluminum nitride (AlN) is deposited using molecular beam epitaxy on the GaN layer 106. In some examples, other types of deposition methods, such as metalorganic chemical vapor deposition, can be used to deposit AlN on the GaN layer 106. AlGaN layer 110 and the GaN layer 106, due to a polarization discontinuity, form the 2DEG 105 at the AlGaN layer 110/GaN layer 106 interface.

Figure 2B:
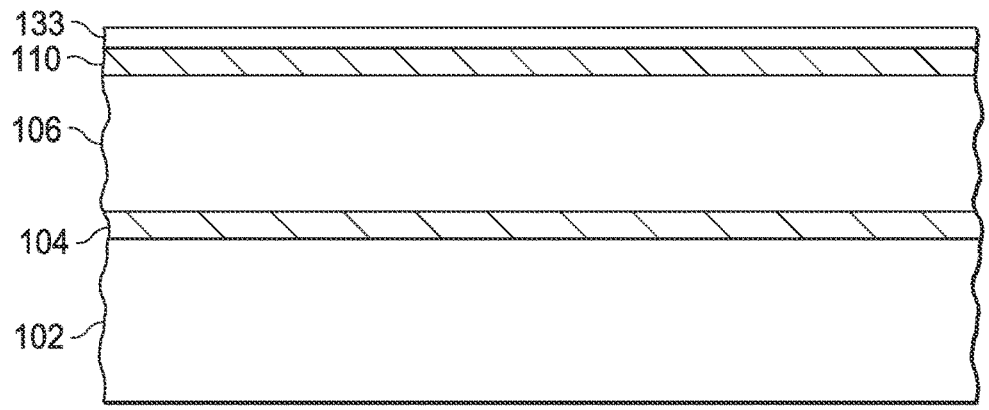
Figure 2C:
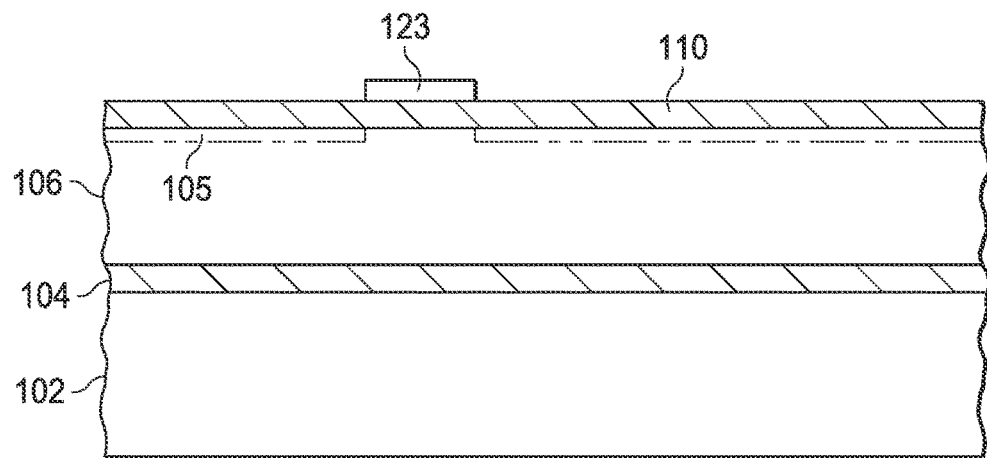

The method 400 proceeds to step 420 (FIG. 2(b)) that includes depositing a p-type GaN layer 133 (hereinafter pGaN layer 133) on the top side 103. For illustration sake, pGaN layer 133 is assumed to be doped with magnesium. In other examples, other suitable dopants may be used. pGaN layer 133 may be fabricated by, first growing GaN layer using molecular beam epitaxy (or other suitable processes)

and then adding p-type dopants, e.g., magnesium. pGaN layer 123 enables the HEMT (being fabricated) to function in the enhancement mode. Because of the presence of pGaN layer 133, 2DEG 105 is depleted from the AlGaN layer 110/GaN layer 106 interface. The method 400 then proceeds to step 430 that includes selectively etching the pGaN layer 133 to form the pGaN layer 123 (FIG. 2(c)). It can be observed that 2DEG 105 is depleted from the AlGaN layer 110/GaN layer 106 interface under the pGaN layer 123.

Figure 2D:
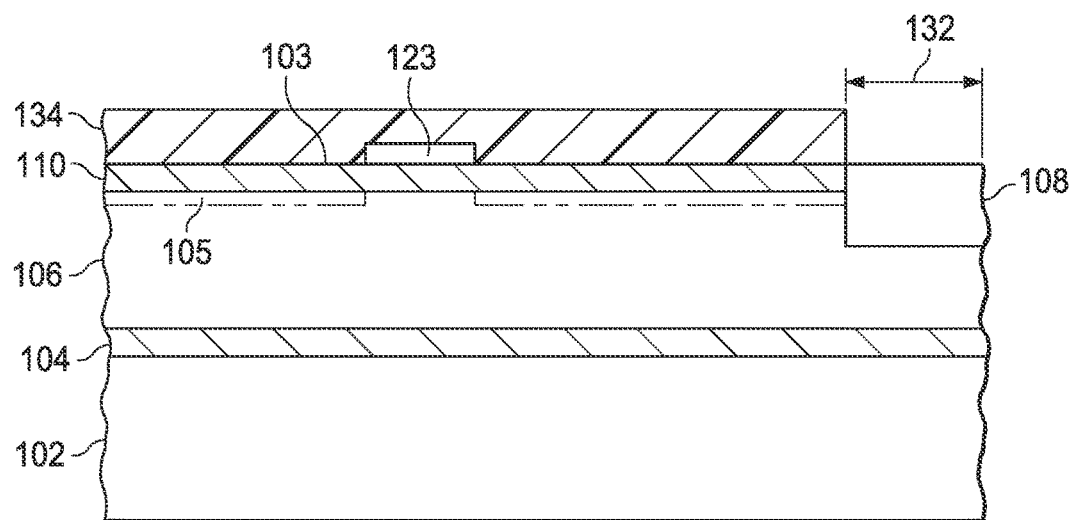
Figure 2E:
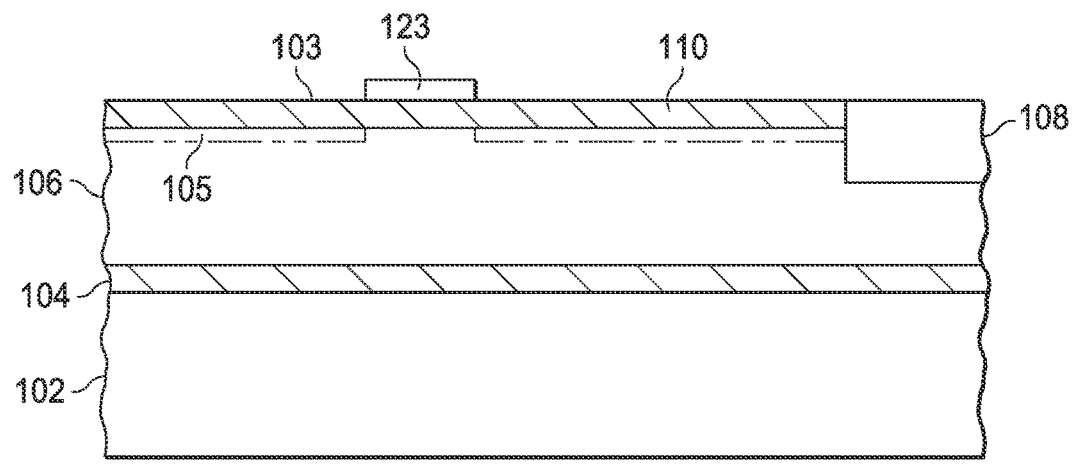
Figure 2F:
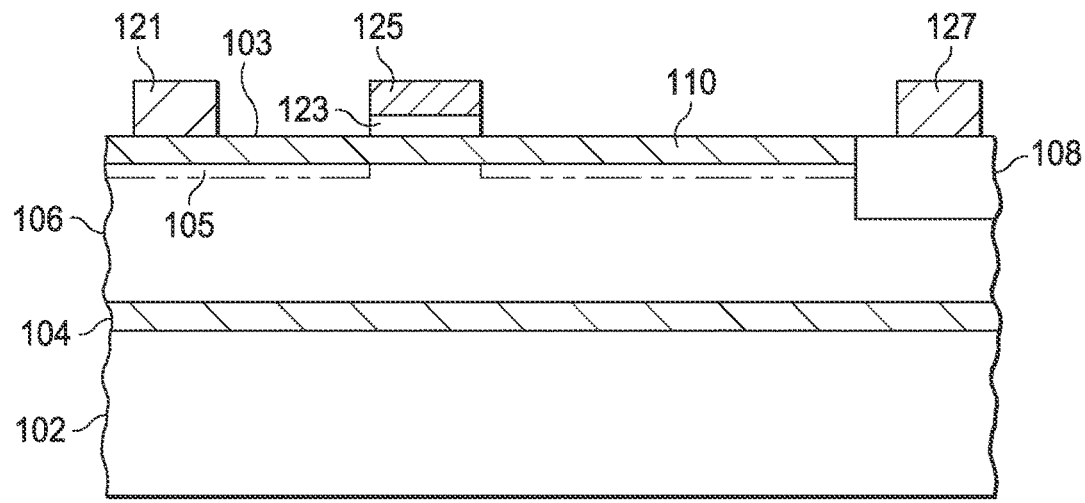

After forming pGaN layer 123, method 400 then proceeds to selectively mask the top surface 103 using the mask layer 134 (FIG. 2(d)). The mask layer 134 may be a dry film or a photoresist film covered on the top surface 103 through a suitable coating process, which may be followed by curing, descum, and the like, further followed by lithography technology and/or etching processes, such as a dry etch and/or a wet etch process, to form an etched region 132. By selectively etching the mask layer 134, the etched region 132 exposes a portion of the top surface 103. Therefore, the mask layer 134 can be said to be selectively masking the top surface 103. After selectively masking the top surface 103, method 400 proceeds to step 450 that includes implanting dopants in the etched region 132 (FIG. 2(e)). The dopants are implanted so as to form the highly-doped region 108, which increases the electron density of the 2DEG 105 where the dopants are implanted. In other words, the highly-doped region 108 increases the channel density of the 2DEG 105 where the dopants are implanted. In this example, the dopants are implanted below the drain contact structure 127 (which will be subsequently formed). In some examples, the highly-doped region 108 is formed using for example, silicon, germanium as dopants, which are implanted using an ion implantation technique. In other examples, other suitable implantation techniques may be employed. One highly-doped region is depicted in FIG. 2(e). However, as noted above in FIGS. 1(c) and 1(d), multiple highly-doped regions may be formed. In such examples, step 440 may include selectively masking the top surface 103 such that multiple regions of the top surface 103 are exposed. In such an example, in step 450, multiple highly-doped regions may be formed (as depicted in FIGS. 1(c) and 1(d)). Following step 450, the method 400 proceeds to step 460 that includes depositing, using for instance a metal-deposition process (sputter, evaporation, etc.), the drain contact structure 127, the gate contact structure 125, and the source contact structure 121 (FIG. 2(f)).

Figure 3A:
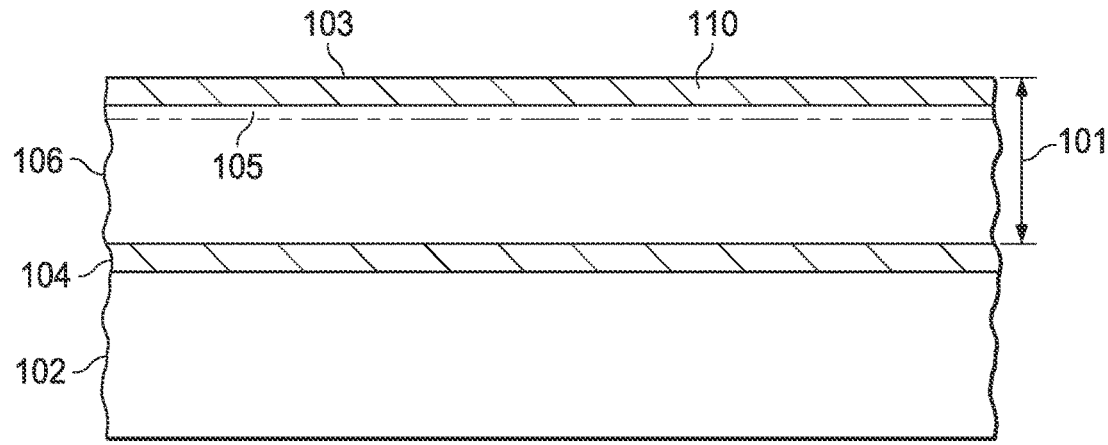
FIGS. 3(a)-3(d) are illustrative flow diagrams depicting the steps involved in fabricating a depletion mode HEMT, in accordance with various examples.
Figure 5:
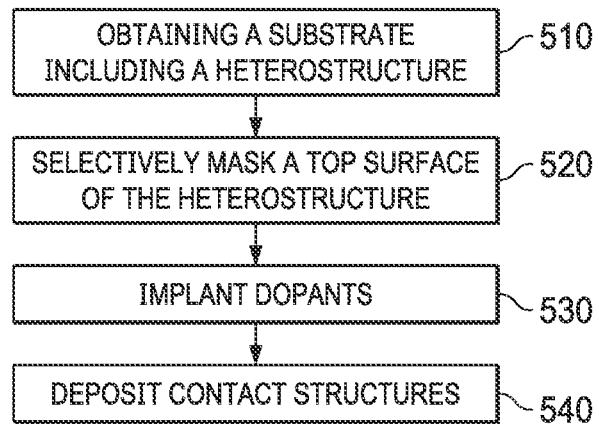
FIG. 5 depicts an illustrative method to fabricate a d-HEMT, in accordance with various examples.

Referring now to FIG. 5, an illustrative method 500 to fabricate a d-HEMT that includes one or more highly-doped regions is shown. FIGS. 3(a)-3(d) are illustrative flow diagrams depicting at least some of the steps involved in fabricating the depletion mode HEMT that includes one or more highly-doped regions. The method 500 is now described in tandem with FIGS. 3(a)-3(d). The method 500 is similar to the method 400, except for fabricating pGaN layers 133, 123 (FIGS. 2(b), 2(c)) on the top surface 103 (steps 420, 430). The method 500 begins with obtaining the substrate 102 that has a heterostructure 101 (step 510; FIG. 3(a)) positioned on it. The description of the heterostructure 101 provided above for FIG. 2(a) also applies to the heterostructure 101 of FIG. 3(a).

Figure 3B:
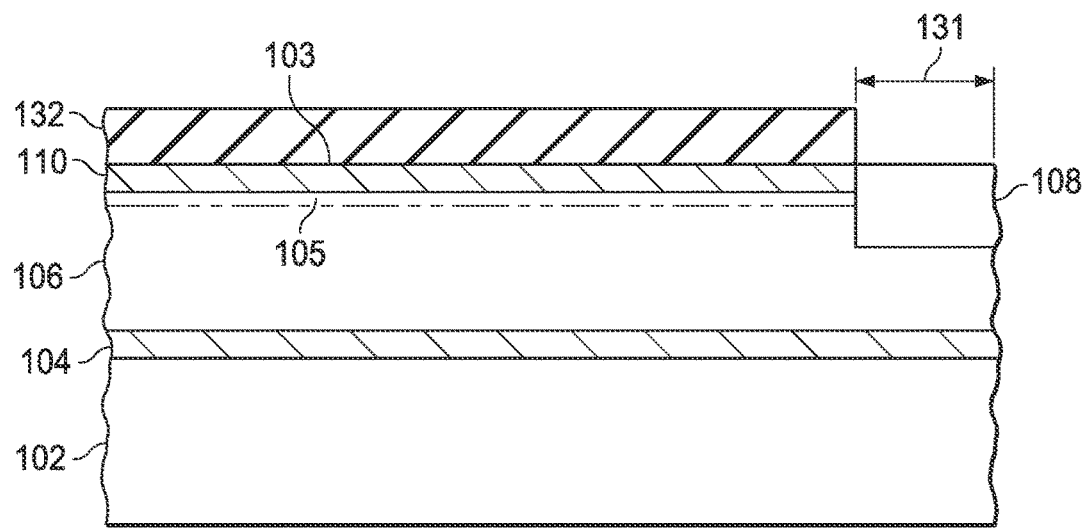
Figure 3C:
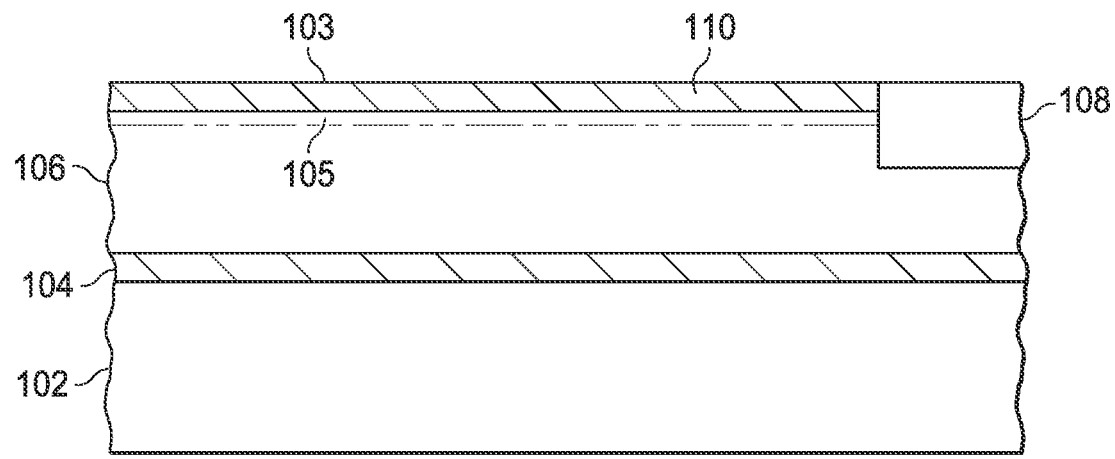
Figure 3D:
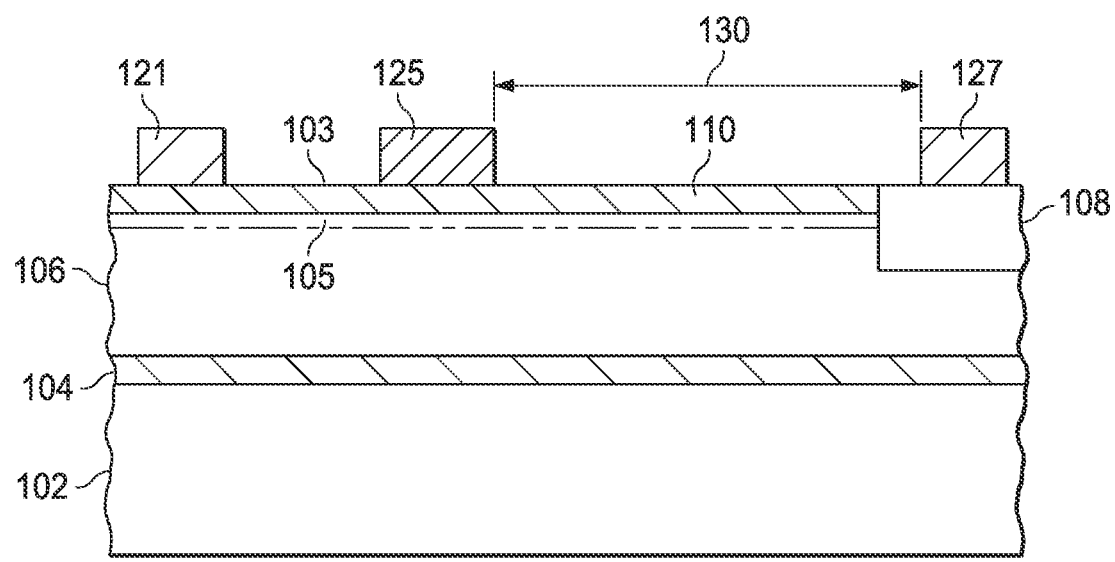

The method 500 then proceeds to step 520 that includes selectively masking the top surface 103 using a mask layer 132 (FIG. 3(b)). The mask layer 132 may be a dry film or a photoresist film covered on the top surface 103 through a suitable coating process, which may be followed by curing, descum, and the like, further followed by lithography technology and/or etching processes, such as a dry etch and/or a wet etch process to form an etched region 131. By selectively etching the mask layer 132, the etched region 131 exposes a portion of the top surface 103. Therefore, in other words, the mask layer 132 can be noted to selectively mask the top surface 103. After selectively masking the top surface 103, method 500 proceeds to step 530 that includes implanting dopants in the etched region 131 (FIG. 3(b)). The dopants are implanted so as to form the highly-doped region 108, which increases the electron density in the 2DEG 105 below the drain contact structure 127 (which will be subsequently formed). In some examples, the highly-doped region 108 is formed using, e.g., silicon, germanium dopants, which are implanted using an ion implantation technique. In other examples, other suitable implantation techniques may be employed. Following the implantation, the mask layer 132 is removed from the top surface 103 (FIG. 3(c)). FIG. 3(c) depicts one highly-doped region. However, as noted above in the description of depletion mode HEMT, multiple highly-doped regions may be formed in an HEMT. In such examples, step 520 may include selectively masking the top surface 103 such that multiple portions of the top surface 103 are exposed, which subsequently leads to the formation of multiple highly-doped regions. Following step 530, method 500 then proceeds to step 540 that includes depositing, using for instance a metal-deposition process (sputter, evaporation, etc.), the drain contact structure 127, the gate contact structure 125, and the source contact structure 121 (FIG. 3(d)).

In the foregoing discussion and in the claims, the terms "including" and "comprising" are used in an open-ended fashion, and thus should be interpreted to mean "including, but not limited to . . . ." Also, the term "couple" or "couples" is intended to mean either an indirect or direct connection. Thus, if a first device couples to a second device, that connection may be through a direct connection or through an indirect connection via other devices and connections. Similarly, a device that is coupled between a first component or location and a second component or location may be through a direct connection or through an indirect connection via other devices and connections. An element or feature that is "configured to" perform a task or function may be configured (e.g., programmed or structurally designed) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof. Additionally, uses of the phrases "ground" or similar in the foregoing discussion are intended to include a chassis ground, an Earth ground, a floating ground, a virtual ground, a digital ground, a common ground, and/or any other form of ground connection applicable to, or suitable for, the teachings of the present disclosure. Unless otherwise stated, "about," "approximately," or "substantially" preceding a value means+/−10 percent of the stated value.

The above discussion is meant to be illustrative of the principles and various embodiments of the present disclosure. Numerous variations and modifications will become apparent to those skilled in the art once the above disclosure is fully appreciated. It is intended that the following claims be interpreted to embrace all such variations and modifications.

What is claimed is:

1. A method for fabricating a transistor, comprising:
   forming a heterostructure over a substrate, the heterostructure including a gallium nitride (GaN) layer, and a GaN-based alloy layer disposed on the GaN layer and having a top side;
   implanting dopants directly to the top side of the GaN-based alloy layer to form a doped region extending from the top side into the GaN layer in a drain access region; and
   depositing source, drain, and gate contact structures that are supported by the GaN layer.

2. The method of claim 1, further comprising depositing a p-type GaN layer (pGaN) on the top side, wherein the gate contact structure is supported by the pGaN layer.

3. The method of claim 2, wherein the doped region is a first doped region, the method further comprising implanting the dopants to form a second doped region extending from the top side into the GaN layer.

4. The method of claim 3, wherein the dopants includes silicon, geranium, or both.

5. The method of claim 1, wherein the drain contact structure at least partially contacts the doped region.

6. The method of claim 1, wherein the GaN-based alloy layer comprises Al(X) In(Y)Ga(1-X-Y)N, where X and Y are concentrations of Aluminum and Indium, respectively.

7. A method for fabricating a transistor on a substrate including a gallium nitride (GaN) layer and a GaN-based alloy layer disposed on the GaN layer, comprising:
   implanting dopants directly to a top side of the GaN-based alloy layer to form a doped region extending through the GaN-based alloy layer into the GaN layer in a drain access region; and
   forming source, drain, and gate contact structures that are supported by the GaN layer, wherein:
      the drain contact structure has a first edge nearest the gate contact structure and a second edge opposite the first edge;
      the doped region has a first edge nearest the gate contact structure and a second edge opposite the first edge; and
      the second edge of the doped region is laterally closer to the gate contact structure than the second edge of the drain contact structure such that the drain contact structure extends past the doped region.

8. The method of claim 7, further comprising depositing a p-type GaN layer (pGaN) on the GaN-based alloy layer, wherein the gate contact structure is supported by the pGaN layer.

9. The method of claim 8, wherein the doped region is a first doped region, the method further comprising implanting the dopants to form a second doped region extending through the GaN-based alloy layer into the GaN layer.

10. The method of claim 9, wherein the dopants includes silicon, geranium, or both.

11. The method of claim 7, wherein the drain contact structure at least partially contacts the doped region.

12. The method of claim 7, wherein the doped region is a first doped region, the method further comprising implanting the dopants to form a second doped region extending through the GaN-based alloy layer into the GaN layer.

13. The method of claim 12, wherein the dopants includes silicon, germanium, or both.

14. The method of claim 7, wherein the GaN-based alloy layer comprises Al(X) In(Y)Ga(1-X-Y)N, where X and Y are the concentrations of Aluminum and Indium, respectively.

15. The method of claim 7, wherein the doped region is laterally offset from the drain contact structure.

16. A method for fabricating a transistor, comprising:
   obtaining a substrate including a gallium nitride (GaN) layer, a GaN-based alloy layer disposed on the GaN layer and having a top side;
   implanting dopants to form a doped region extending from the top side into the GaN layer in a drain access region while blocking the dopants from a source region and a gate region of the transistor; and
   depositing source, drain, and gate contact structures that are supported by the GaN layer, wherein the drain contact structure at least partially contacts the doped region.

17. A method for fabricating a transistor on a substrate including a gallium nitride (GaN) layer and a GaN-based alloy layer disposed on the GaN layer, comprising:
   implanting dopants to form a doped region extending through the GaN-based alloy layer into the GaN layer in a drain access region; and
   forming source, drain, and gate contact structures that are supported by the GaN layer, wherein:
      the drain contact structure has a first edge nearest the gate contact structure and a second edge opposite the first edge;
      the doped region has a first edge nearest the gate contact structure and a second edge opposite the first edge;
      the second edge of the doped region is laterally closer to the gate contact structure than the second edge of the drain contact structure such that the drain contact structure extends past the doped region; and
      the drain contact structure at least partially contacts the doped region.

18. The method of claim 1, wherein implanting the dopants directly to the top side of the GaN-based alloy layer including blocking the dopants from a source region and a gate region of the transistor.

19. The method of claim 1, wherein the doped region is a first doped region, the method further comprising implanting the dopants to form a second doped region extending from the top side into the GaN layer.

20. The method of claim 19, wherein the dopants includes silicon, germanium, or both.

21. The method of claim 1, wherein the doped region has a dopant concentration greater than $1 \times 10^{17}$ cm$^{-3}$.

22. The method of claim 7, wherein the doped region has a dopant concentration greater than $1 \times 10^{17}$ cm$^{-3}$.

* * * * *